United States Patent
Hsu et al.

(10) Patent No.: US 6,759,694 B1
(45) Date of Patent: Jul. 6, 2004

(54) SEMICONDUCTOR PHOTOTRANSISTOR

(75) Inventors: Yu-Min Hsu, Hsinchu (TW); Jin-Wei Shi, Hsinchu (TW); Zing-Way Pei, Hsinchu (TW); Fon Yuan, Hsinchu (TW); Chee-Wee Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/718,621

(22) Filed: Nov. 24, 2003

(30) Foreign Application Priority Data

Sep. 10, 2003 (TW) ........................................ 92124983 A

(51) Int. Cl.[7] .............................................. H01L 31/11
(52) U.S. Cl. ........................ 257/187; 257/197; 257/198; 257/462; 257/577; 257/585; 257/586; 257/590; 257/593
(58) Field of Search ................................. 257/184, 187, 257/197, 198, 462, 577, 585, 586, 590, 593

(56) References Cited

U.S. PATENT DOCUMENTS

| | | | |
|---|---|---|---|
| 4,833,511 A | | 5/1989 | Sugimoto |
| 5,204,544 A | * | 4/1993 | Inoue et al. ................. 257/462 |
| 5,712,497 A | * | 1/1998 | Watanabe et al. ........... 257/218 |
| 5,844,253 A | | 12/1998 | Kim et al. |
| 6,525,348 B1 | | 2/2003 | Scott et al. |
| 6,528,828 B2 | * | 3/2003 | Uemura ....................... 257/197 |

FOREIGN PATENT DOCUMENTS

JP 63-73568 * 4/1988 ........... H01L/31/10

* cited by examiner

*Primary Examiner*—Bradley Baumeister
(74) *Attorney, Agent, or Firm*—Birch, Stewart, Kolasch & Birch, LLP

(57) ABSTRACT

A phototransistor structure is disclosed. A sidewall is grown on the collector side and under the base. The surface of the sidewall is formed with a sidewall contact. When the contact is connected to an external voltage, the holes accumulated at the junction of the base and emitter can be quickly removed. This solves the problem in the prior art that using a bias between the base and the emitter to remove holes usually results in a large dark current (bias current), power consumption, and diminishing optoelectronic conversion gain.

17 Claims, 9 Drawing Sheets

SEMICONDUCTOR PHOTOTRANSISTOR

This Nonprovisional application claims priority under 35 U.S.C. § 119(a) on Patent Application No(s). 092124983 filed in TAIWAN on Sep. 10, 2003, the entire contents of which are hereby incorporated by reference.

BACKGROUND OF THE INVENTION

1. Field of Invention

The invention relates to a phototransistor and, in particular, to a semiconductor phototransistor that uses a sidewall structure to increase the device speed and electrical bandwidth.

2. Related Art

Photodetectors (PDs) that use silicon crystals to replace group III–V compound semiconductors have the advantages of low costs, high yields, and high integratability in post circuits in the fiber communications market. However, their indirect bandgap, and relatively low electron mobility make the optoelectronic devices have worse performance than the group III–V semiconductors near the fiber communications wavelengths (~0.85 µm, 1.3~1.55 µm).

In the normal PDs made of silicon crystals, one needs to use the deep trench, silicon on insulator (SOI), and wafer bonding techniques in order for the speed to be greater than 2.5 GBits/sec. Such techniques not only greatly increase the costs, but also amplify the difficulty in integrating post circuit systems. In comparison, the heterojunction phototransistor (HPT) does not need to use the SOI substrate. Not only does it solve the substrate current problem, it is also relatively easy to integrate with the post bipolar transistor circuits.

Besides, the large photocurrent gain in such devices can compensate for the drawback that the silicon crystal has relative weaker photo absorption constant than III–V materials, achieving the required response. In comparison with the technique of another type of PDs with gains, the avalanche photodiode (APD), phototransistors not only are able to provide larger gains at lower operating voltages, they also do not require the use of complicated voltage control and temperature control circuits.

Traditionally, although the HPT's have fairly high responses, the biggest problem is the speed performance. Therefore, the chances of their applications in digital optical fiber communications systems and their commercialization are limited.

There have been many phototransistor related techniques disclosed up to now. For example, the phototransistor disclosed in the U.S. Pat. No. 4,833,511 does not provide any solution in the speed but is only added with a quantum structure to improve the response. The phototransistor disclosed in the U.S. Pat. No. 5,844,253 adds a quantum dot structure to the emitter-base junction, using the thermal electron effect to improve the phototransistor speed performance. The phototransistor disclosed in the U.S. Pat. No. 6,525,348 adopts a conventional dual-end contact mode and uses an optimized base doping method to increase the speed. However, experimental results of the above-mentioned phototransistors are not as expected. Besides, the response speed performance of most phototransistors is around the ns level when operating under the condition that the photocurrent gain is not sacrificed.

When operating normal phototransistors, one usually adopts the base open mode. Its operation is to use photons to excite carriers, providing a virtual bias on the base-emitter (B-E) junction to obtain a large optical gain. However, the electrical bandwidth of phototransistors operating speed in such a mode can only reach the MHz level. It is mainly because the holes excited by the photons will accumulate at the B-E junction and cannot be removed. In order to solve the speed problem, the most direct method is to impose a bias voltage ($V_{BE}$) or a bias current ($I_B$ at the B-E junction. However, this method has some drawbacks and becomes impractical. Such problems include huge dark currents (bias currents) and the resultant power consumption. The gain will also be attenuated because of the imposed bias voltage, therefore greatly increasing the dark current of the device and the standby power consumption.

It is therefore an important technical issue to improve the phototransistor speed performance without sacrificing the device gain and increasing device power consumption.

SUMMARY OF THE INVENTION

In view of the foregoing, an objective of the invention is to provide a phototransistor that has a better speed performance without sacrificing device gains and increasing the device power consumption.

An appropriately doped sidewall is added to the phototransistor structure. A sidewall contact is formed on the sidewall for directly removing the photon-excited holes accumulated at the base-emitter junction.

To achieve the above objective, the disclosed semiconductor phototransistor structure has a sidewall grown on the side of the collector and under the base by implant or epitaxy. A metal sidewall contact is then formed on the sidewall surface. A lowest voltage imposing on the metal contact is enough to remove the holes accumulated on the base-emitter junction, achieving the goal of improving the speed performance.

The disclosed phototransistor structure can decrease the hole removal time and thus speed up the phototransistor. On the other hand, the disclosed structure is completely compatible with the standardized SiGe bipolar transistor manufacturing process in the industry. Therefore, it has applications in opto-electric integrated circuits (OEIC's).

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
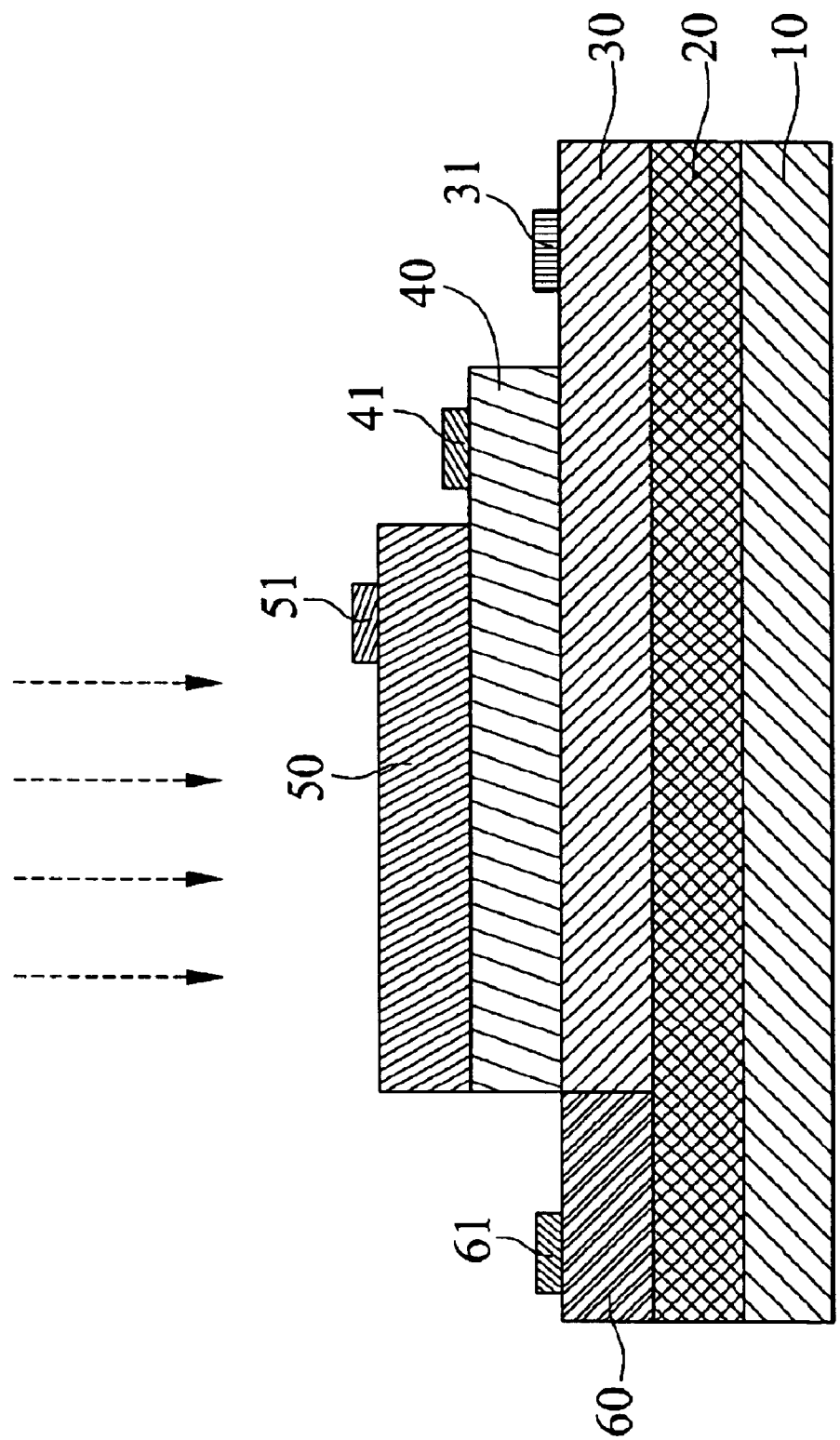
FIG. 1 is a first embodiment of the disclosed phototransistor with a sidewall structure.

FIG. 1 shows a cross-sectional view of a first embodiment of the disclosed phototransistor. The dotted-line shows light direction. As shown in the drawing, the substrate 10 is a semiconductor substrate which is properly doped or semi-insulating substrate. The substrate 10 is grown with an appropriately doped sub-collector (or called buried layer) 20. The sub-collector 20 is preferably to be heavily doped. An appropriately doped collector 30 is formed on the sub-collector 20. A collector electrode 31 is then formed on the appropriately doped collector 30. An appropriately doped base 40, preferably being heavily doped, is formed on the collector 30. Its doping type has to be different from the collector 30 and the sub-collector 10, and its thickness is between 10 nm and 500 nm. Afterwards, a base electrode 41 is formed on the base 40. A heavily doped emitter 50 is formed on the base 40. Finally, an emitter electrode 51 is formed on the emitter 50. Its bandgap width is greater than or equal to that of the base, and its doping type is different from the base. In other words, the doping type of the emitter and the collector is the same, while the doping type of the base is different. Therefore, if the base is N-type doped, the emitter and the collector are P-type doped, and vice versa. However, the N-type doped base has rare applications in practice.

On the edge of the collector 30, an appropriately doped sidewall 60 is defined using semiconductor process technology, such as ion implantation and diffusion. The sidewall 60 is preferably to be heavily doped. If the base is P-type doped, then the sidewall 60 is then an appropriately doped P-type well. If the base is N-type doped, then the sidewall 60 is then an appropriately doped N-type well. A sidewall contact 61 is formed on the sidewall 60. The transverse position of the sidewall 60 is on the edge of the collector 30, and its longitudinal position is roughly under the base 40 and on the same plane as the collector. There can be more than one sidewall 60, distributed on both sides and around the emitter region.

According to the above description, one sees that the essence of the invention is to grow a sidewall that has the same doping type as the base by implantation or epitaxy on the side of the collector and under the base. A metal contact is formed on its surface to be a sidewall contact. Holes are rapidly removed through the sidewall. The biggest difference of the invention from normal phototransistors is a P-type well or N-type well is further grown roughly above the sub-collector and under or surround the base.

During the operation, the sidewall contact is connected with a lowest voltage to remove holes directly via the sidewall. Comparing with the method that uses B-E bias voltage to remove excess holes, the disclosed method does not need to push holes toward the heavily doped emitter. This can save a lot of diffusion current time and greatly reduce the dark current.

Figure 2:
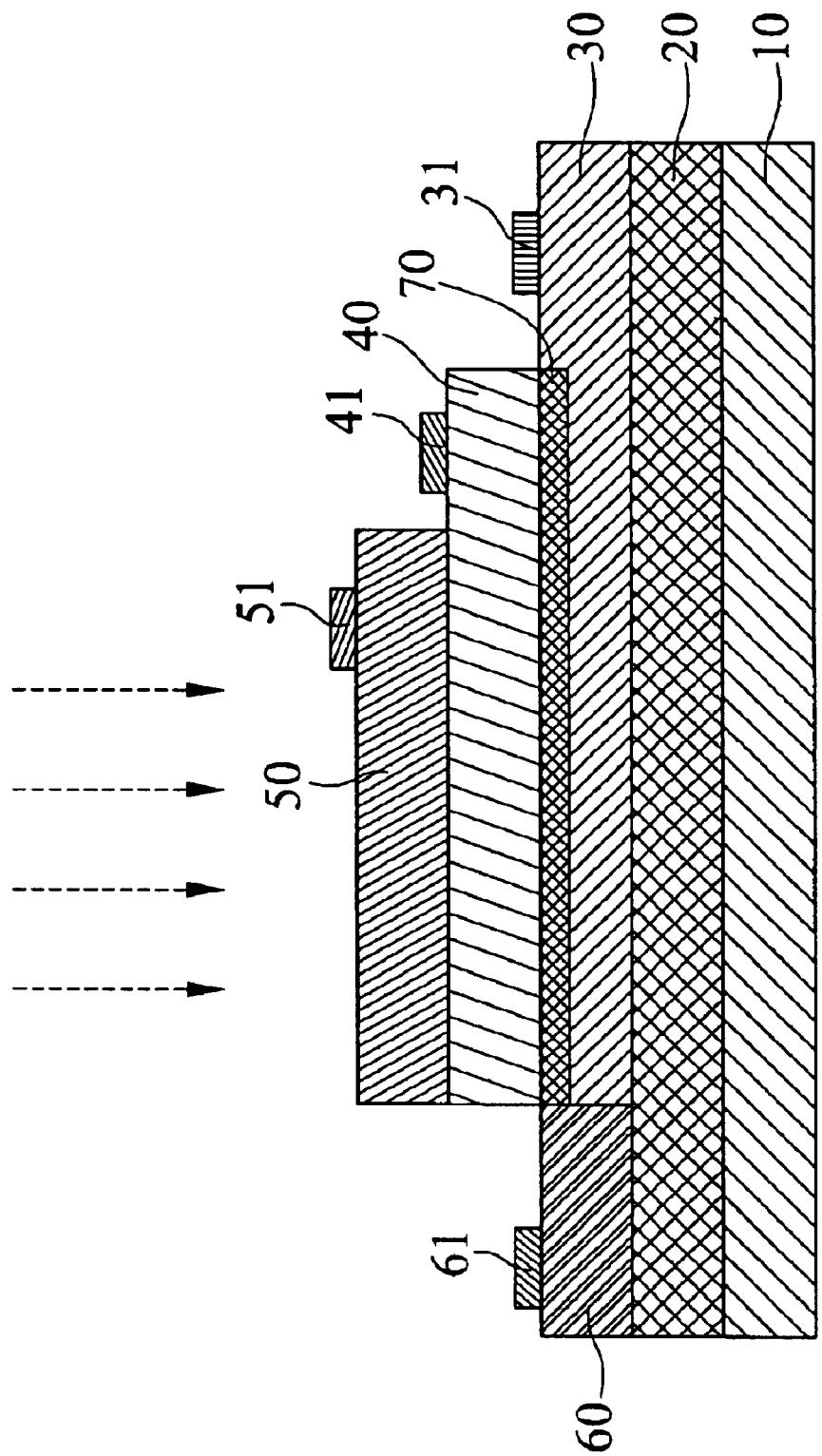
FIG. 2 is a second embodiment of the disclosed phototransistor with a sidewall structure.

The idea of the invention can be applied to phototransistors with a quantum structure. The structure shown in FIG. 2 is different from FIG. 1 in that the collector 30 has a quantum structure 70, such as a quantum well, a super-lattice, or quantum dots, that uses different semiconductor material to grow on the collector 30. The dotted-line shows light direction. Such a quantum structure 70 can simultaneously alleviate the stress imbalance between the epitaxy and the substrate and achieve the goal of optical wavelength absorption. This layer is a photon absorption layer and can adopt P-type or N-type heavy doping.

Aside from the quantum structure, one can use an epitaxy layer that is compatible with the substrate lattice constant but has a narrower band gap for fully absorbing incident light.

In the embodiments shown in FIG. 1 and FIG. 2, the emitter can be made of silicon, the base can be made of SiGe alloy, the photon absorption layer can be made of Si/SiGe MQW, Si/Ge QD, Si(C)/SiGe MQW, SiGe, or SiGe(C) alloy, and the collector and sub-collector can be made of silicon. These epitaxy layers can be grown on a silicon substrate or an SOI. In addition to the above-mentioned materials, the invention can also be implemented using group III–V chemicals or group III–V alloy semiconductors. For instance, the emitter can use InAlAs or InP, the base can use InGaAs or InGaAsP alloy, the photo absorption layer can use the InGaAs alloy, and the collector and sub-collector can use InP or InGaAs. These epitaxy layers can be grown on an InP substrate.

The growth of the above-mentioned epitaxy layers can use the available epitaxy technology and conditions, such as the molecular beam epitaxy (MBE), the chemical vapor deposition (CVD), and the liquid phase deposition (LPD) techniques.

Figure 3:
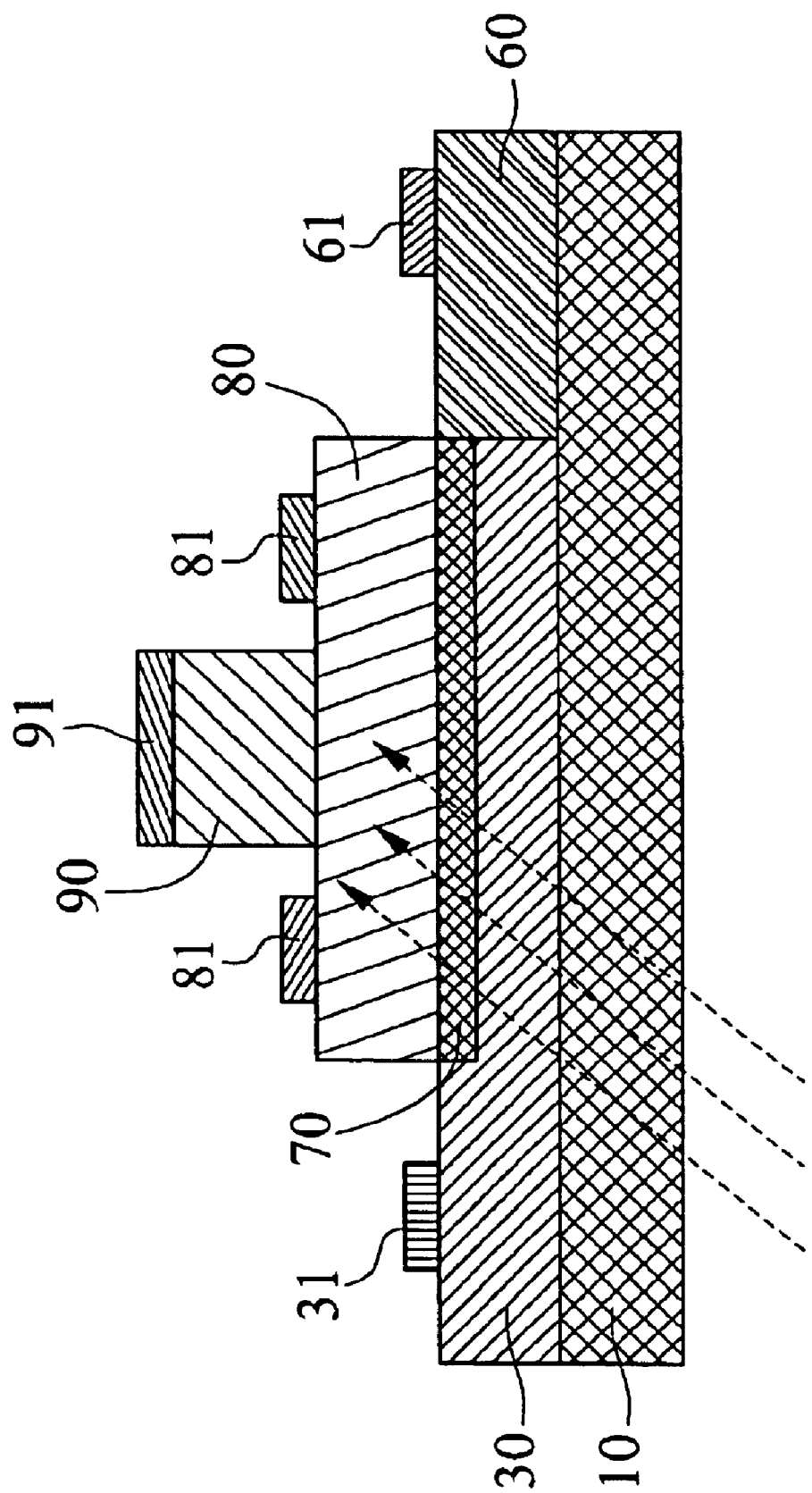
FIG. 3 is a third embodiment of the disclosed phototransistor with a sidewall structure.

A third embodiment of the invention is given in FIG. 3. The dotted-line shows light direction. It is an edge illuminated waveguide phototransistor structure. The substrate 10 is grown with a collector 30, which is formed with a collector electrode 31. The collector 30 is further grown with a base 80, using SiGe as the material. The base 80 is formed with an emitter 90. Two base electrodes 81 are formed on both side of the emitter 90. The emitter 90 is formed with an emitter electrode 91. The collector 30 is defined with a heavily doped sidewall 60, which is formed with a sidewall contact 61. The transverse position of the sidewall 60 is on the edge of the collector 30, and its longitudinal position is roughly under the base 40 and on the same plane as the collector. The sidewall 60 has to be on the same plane as the quantum structure, in order to achieve the goal of lateral conduction.

When high output power is needed, one can make a series of or an array of the disclosed phototransistors to increase the photocurrent of the phototransistors.

The commonly seen substrate contact in the SiGe HBT is employed to implement the idea. For the comparison between the first embodiment and the prior art, please refer to FIG. 4 and FIG. 5. In our study devices, the substrate terminal is not optimized for high speed performance. Moreover, when the emitter of the device becomes smaller, the transverse transport distance between the sidewall contact and holes is smaller, thus more obvious improvement in the speed performance than reported values, as shown in FIG. 4 and FIG. 5 can be expected.

Figure 4:
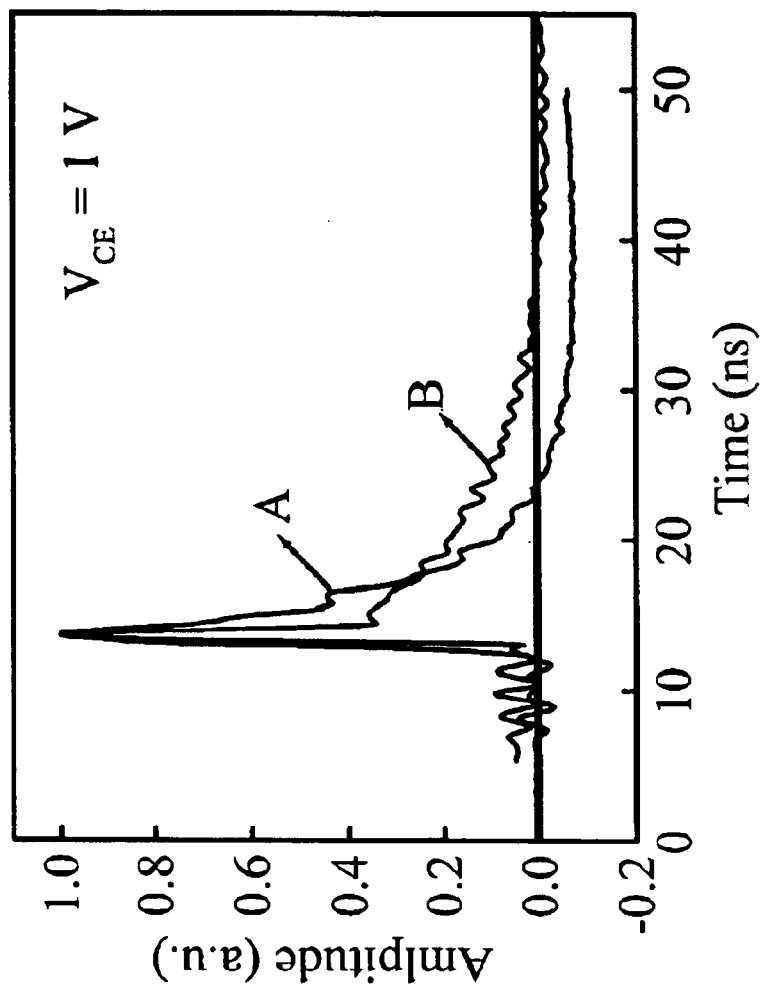
FIG. 4 compares the pulse responses of a phototransistor with an open sidewall contact when the base contact is open and ground.
Figure 5:
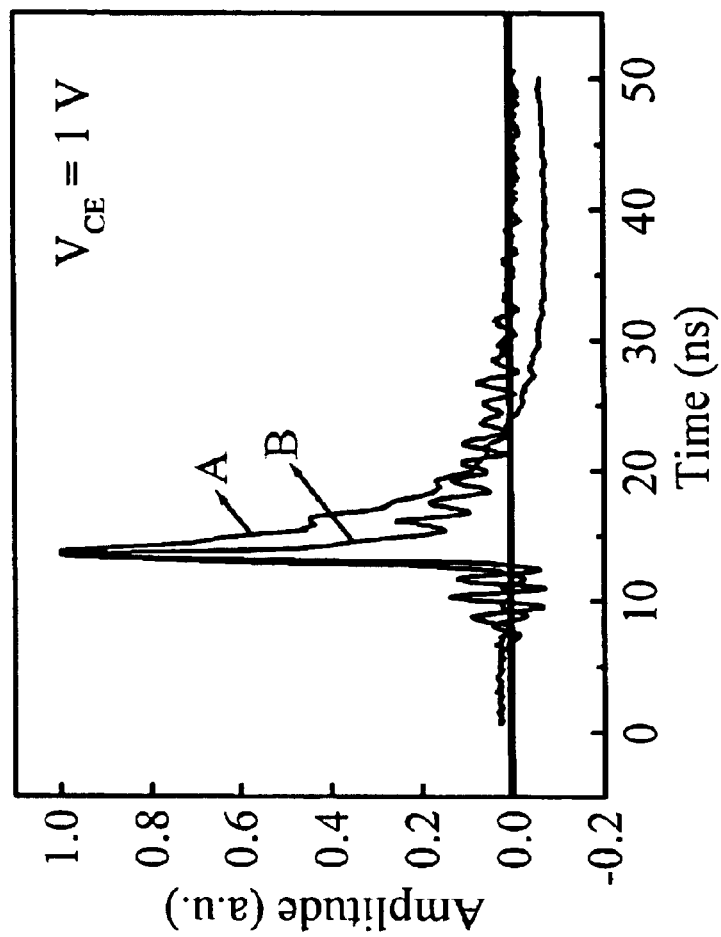
FIG. 5 compares the pulse responses of a phototransistor with base contact open when the sidewall contact is open and ground.

FIG. 4 compares the pulse responses when the base contact is open and ground, with the sidewall contact open and $V_{CE}$ being 1V. TRACE A is for the open base contact and TRACE B is for the ground base contact. The pulse responses are obtained under impact of 850 nm light. From FIG. 4, we know that although the FWHM (Full Width of Half Maximum) of measured impulse response reduces from 2.5 ns to 0.95 ns, the photocurrent reduces from 15 $\mu$A to 0.1 $\mu$A. FIG. 5 shows the speed performance after using the sidewall contact. The base contact is open. The plot compares the pulse responses when the sidewall contact is open (TRACE A) and ground (TRACE B). To compare with FIG. 4, the base contact in FIG. 5 is open. We see that the FWHM of measured impulse response reduces from 2.5 ns to 0.85 ns whereas the photocurrent only drops from 15 $\mu$A to 8.7 $\mu$A. It is obvious that the photocurrent gain in the invention is not largely sacrificed in comparison with the prior art.

Figure 6:
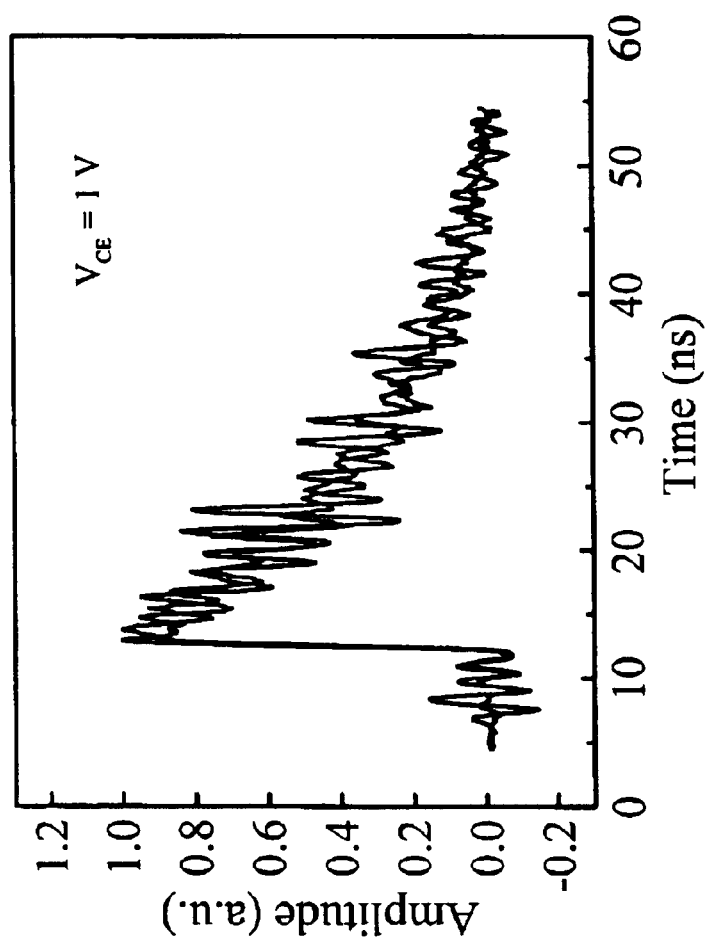
FIG. 6 compares the pulse responses of a phototransistor with a quantum structure and an open sidewall contact when the base contact is open and ground.
Figure 7:
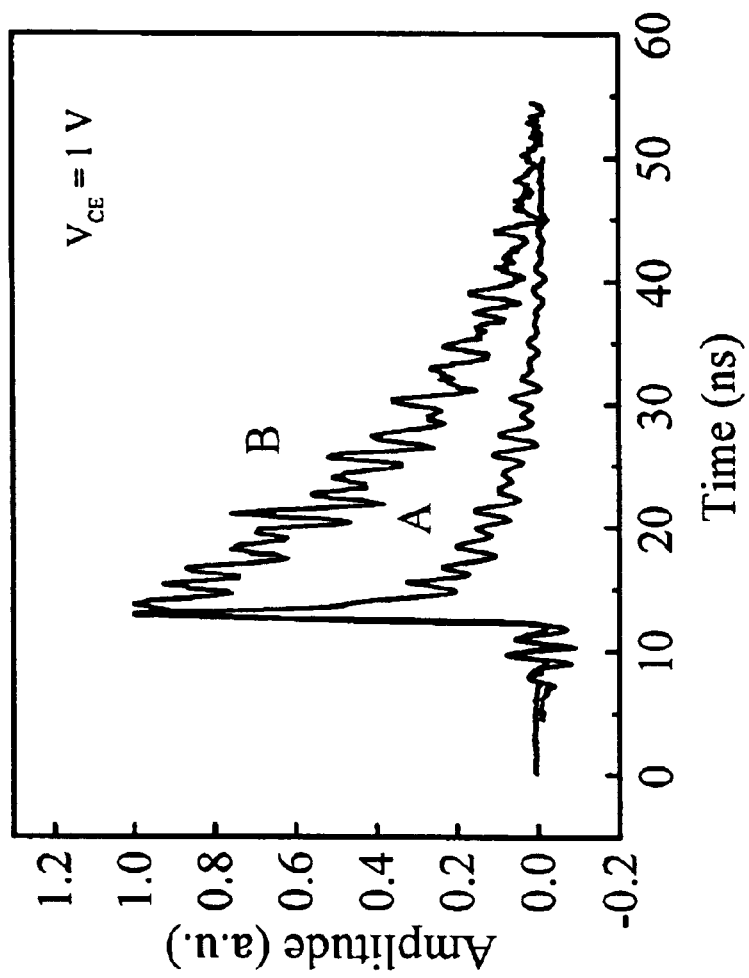
FIG. 7 compares the pulse responses of a phototransistor with a quantum structure and base contact open when the sidewall contact is open and ground.

To compare the second embodiment with the prior art, please refer to FIG. 6 and FIG. 7 that show the speed performance of SiGe phototransistors with a quantum structure after the sidewall contact is used.

In FIG. 6, the sidewall contact is open. We compare the pulse responses under 850 nm light excitation when the base contact is open (TRACE A) and ground (TRACE B). It is seen that although the FWHM of measured impulse response is almost unchanged, the photocurrent drops tremendously from 90 $\mu$A to 0.11 $\mu$A.

FIG. 7 shows the speed performance after the sidewall is employed. Again, we compare the situations when the sidewall contact is open (TRACE A) and ground (TRACE B). From the plot, we see that the FWHM of measured impulse response reduces from 7.7 ns to 1 ns whereas the photocurrent only decreases from 90 $\mu$A to 45 $\mu$A.

From FIG. 6 and FIG. 7, we know that the disclosed sidewall contact can greatly improve the speed performance of phototransistors with a quantum structure almost without sacrificing the gain in comparison with the idea of BE bias in the prior art. This is because the carrier trapping effect is very serious in the quantum structure. After using the sidewall contact, the trapped carrier can be removed due to the lateral conduction.

Figure 8:
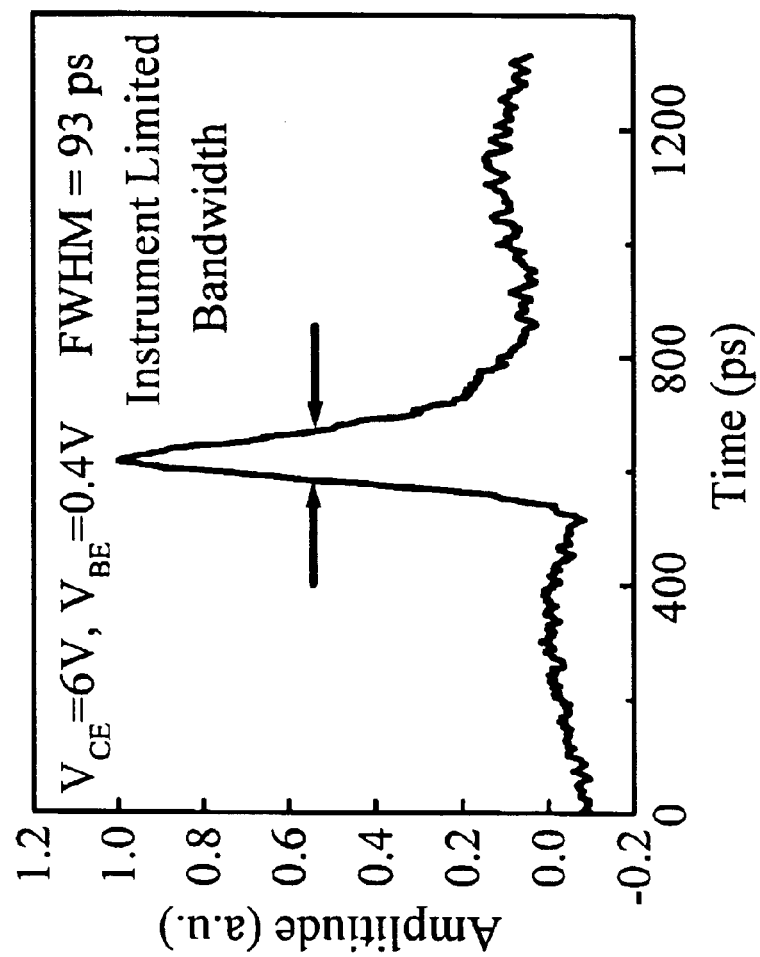
FIG. 8 shows the pulse response of the disclosed phototransistor measured in the linear region.
Figure 9:
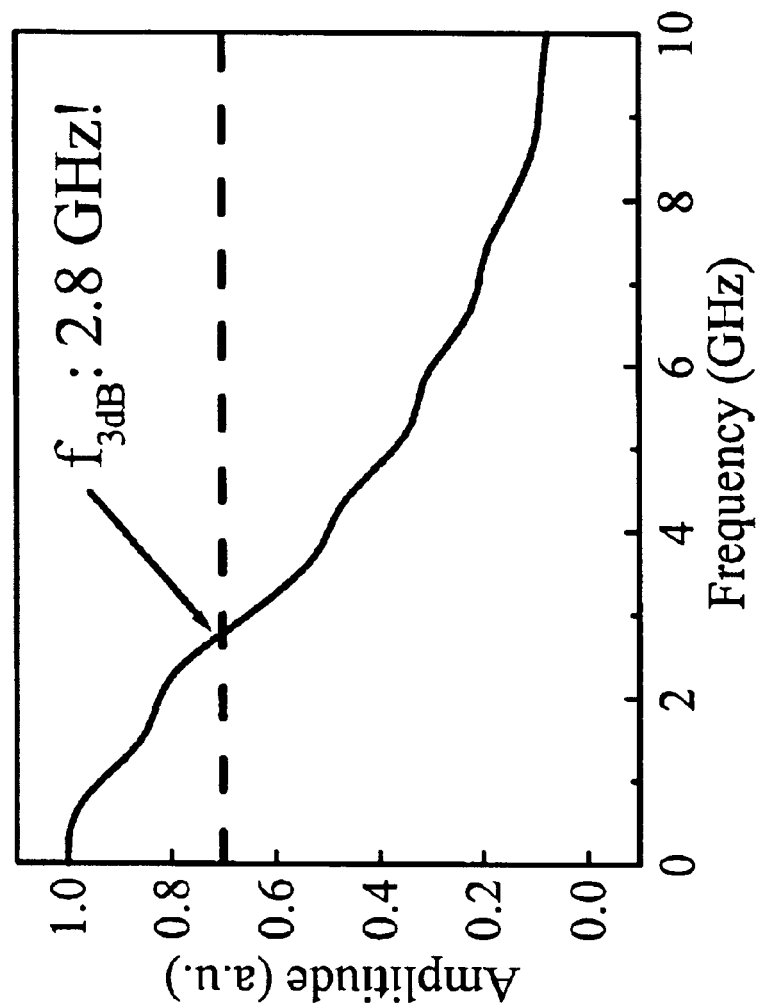
FIG. 9 shows the electrical bandwidth obtained from FIG. 8 after Fourier transformation.

The disclosed phototransistor with the sidewall contact structure also has the feature of increasing speeds in the linear region under an appropriate photon power excitation. FIG. 8 shows the pulse response measured in the linear region, and FIG. 9 shows the electrical bandwidth obtained from FIG. 8 after using Fourier transformation. Under the excitation of 850 nm light, the electrical bandwidth is about 3 GHz, proving the feasibility of the invention in optical fiber communications.

The disclosed phototransistor structure provides new applications in OEIC's that primarily use heterojunction bipolar phototransistors as the basis. For example, the sidewall contact can effectively control the size and shape of the output waveform. If the contact is connected to a control signal source or an external circuit, it can be combined to provide direct-injection-locking clock recovery circuits or opto-electric frequency mixing circuits.

Certain variations would be apparent to those skilled in the art, which variations are considered within the spirit and scope of the claimed invention.

What is claimed is:

1. A semiconductor phototransistor comprising:

a substrate;

an appropriately doped collector formed on the substrate, which is formed with a collector electrode thereon;

an appropriately doped base formed on the collector, which has a different doping type from the collector and is formed with a base electrode thereon;

an appropriately doped emitter formed on the base, which has the same doping type as the collector and is formed with an emitter electrode; and an appropriately doped sidewall, which has the same doping type as the base, has a transverse position roughly on the edge of the collector, a longitudinal position roughly under the base and on the same plane as the collector, and is formed with a sidewall contact so that holes accumulated at the base-emitter junction can be removed through the sidewall when the sidewall contact is connected with a lowest voltage.

2. The semiconductor phototransistor of claim 1, wherein the substrate is selected from a semiconductor substrate which is appropriately doped or semi-insulating.

3. The semiconductor phototransistor of claim 1 further comprising an appropriately doped sub-collector formed on the substrate, with a different doping type from the substrate.

4. The semiconductor phototransistor of claim 1, wherein the bandgap energy of the emitter is greater than or equal to that of the base.

5. The semiconductor phototransistor of claim 1, wherein there is a plurality of the sidewalls distributed on both sides and around the emitter.

6. The semiconductor phototransistor of claim 1, wherein the collector further contains a quantum structure grown on the collector using different materials alternately.

7. The semiconductor phototransistor of claim 6, wherein the quantum structure is a quantum well.

8. The semiconductor phototransistor of claim 6, wherein the quantum structure is a super-lattice.

9. The semiconductor phototransistor of claim 6, wherein the quantum structure is quantum dots.

10. A semiconductor phototransistor comprising:

a substrate;

an appropriately doped collector formed on the substrate, which is formed with a collector electrode thereon;

an appropriately doped base formed on the collector, which has a different doping type from the collector and is formed with two base electrodes thereon;

an appropriately doped emitter formed on the base, which has the same doping type as the collector and is formed with an emitter electrode; and an appropriately doped sidewall, which has the same doping type as the base, has a transverse position roughly on the edge of the collector, a longitudinal position roughly under the base and on the same plane as the collector, and is formed with a sidewall contact so that holes accumulated at the base-emitter junction can be removed through the sidewall when the sidewall contact is connected with a lowest voltage.

11. The semiconductor phototransistor of claim 10, wherein the substrate is selected from a semiconductor substrate which is appropriately doped or semi-insulating.

12. The semiconductor phototransistor of claim 10 further comprising an appropriately doped sub-collector formed on the substrate, with a different doping from the collector.

13. The semiconductor phototransistor of claim 10, wherein there is a plurality of the sidewalls distributed on both sides and around the emitter.

14. The semiconductor phototransistor of claim 10, wherein the collector further contains a quantum structure grown on the collector using different materials alternately.

15. The semiconductor phototransistor of claim 14, wherein the quantum structure is a quantum well.

16. The semiconductor phototransistor of claim 14, wherein the quantum structure is a super-lattice.

17. The semiconductor phototransistor of claim 14, wherein the quantum structure is quantum dots.

* * * * *